United States Patent
Lee et al.

(10) Patent No.: US 12,292,479 B2
(45) Date of Patent: May 6, 2025

(54) BATTERY MANAGEMENT APPARATUS AND METHOD

(71) Applicant: LG ENERGY SOLUTION, LTD., Seoul (KR)

(72) Inventors: Hu-Jun Lee, Daejeon (KR); Jung-Hyun Kwon, Daejeon (KR); Sang-Hoon Lee, Daejeon (KR); Seok-Hyeong Ham, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 134 days.

(21) Appl. No.: 18/025,357

(22) PCT Filed: Oct. 6, 2021

(86) PCT No.: PCT/KR2021/013728
§ 371 (c)(1),
(2) Date: Mar. 8, 2023

(87) PCT Pub. No.: WO2022/080745
PCT Pub. Date: Apr. 21, 2022

(65) Prior Publication Data
US 2023/0333169 A1 Oct. 19, 2023

(30) Foreign Application Priority Data
Oct. 12, 2020 (KR) ........................ 10-2020-0131452

(51) Int. Cl.
*G01R 31/371* (2019.01)
*G01R 31/3835* (2019.01)

(52) U.S. Cl.
CPC ....... *G01R 31/371* (2019.01); *G01R 31/3835* (2019.01)

(58) Field of Classification Search
None
See application file for complete search history.

(56) References Cited

U.S. PATENT DOCUMENTS

| 10,684,330 B2 | 6/2020 | Karner et al. |
| 2012/0091968 A1 | 4/2012 | Heo et al. |

(Continued)

FOREIGN PATENT DOCUMENTS

| JP | 2001-320336 A | 11/2001 |
| JP | 2017-215294 A | 12/2017 |

(Continued)

OTHER PUBLICATIONS

Supplementary European Search Report for European Application No. 21880392.2, dated Mar. 12, 2024.

(Continued)

*Primary Examiner* — Jas A Sanghera
(74) *Attorney, Agent, or Firm* — Birch, Stewart, Kolasch & Birch, LLP

(57) ABSTRACT

Discussed is a battery management apparatus that may include a voltage measuring unit configured to measure a voltage of a battery; a communication unit configured to output voltage information for the voltage measured by the voltage measuring unit; a power unit configured to provide an operation power to the communication unit; an environment information measuring unit configured to measure environment information including at least one of ambient temperature and humidity of the power unit; and a control unit configured to receive the measured environment information from the environment information measuring unit, judge whether the power unit is operable based on at least one of the received environment information, a capacity of the power unit, and a consumed current and a communication time consumed for the communication unit to output the voltage information, and control the communication unit according to a judgment result about whether the power unit is operable.

15 Claims, 3 Drawing Sheets

(56) References Cited

U.S. PATENT DOCUMENTS

| | | | |
|---|---|---|---|
| 2013/0093383 A1 | 4/2013 | Kim et al. | |
| 2014/0184234 A1* | 7/2014 | Okabe | H01M 10/42 |
| | | | 324/426 |
| 2014/0327393 A1 | 11/2014 | Lee et al. | |
| 2016/0294019 A1* | 10/2016 | Yamauchi | H01M 10/48 |
| 2017/0182906 A1 | 6/2017 | Park et al. | |
| 2019/0033388 A1 | 1/2019 | Karner et al. | |
| 2019/0039458 A1 | 2/2019 | Ryu | |
| 2019/0280493 A1 | 9/2019 | Belkacem-Boussaid et al. | |
| 2021/0325472 A1 | 10/2021 | Lee et al. | |

FOREIGN PATENT DOCUMENTS

| | | |
|---|---|---|
| JP | 2018-80982 A | 5/2018 |
| KR | 10-1391876 B1 | 5/2014 |
| KR | 10-1570809 B1 | 11/2015 |
| KR | 10-1934857 B1 | 1/2019 |
| KR | 10-1974015 B1 | 5/2019 |
| KR | 10-2019-0125906 A | 11/2019 |
| KR | 10-2039350 B1 | 11/2019 |
| KR | 10-2020-0049770 A | 5/2020 |
| KR | 10-2156403 B1 | 9/2020 |

OTHER PUBLICATIONS

International Search Report (PCT/ISA/210) issued in PCT/KR2021/013728 mailed on Jan. 24, 2022.

* cited by examiner

BATTERY MANAGEMENT APPARATUS AND METHOD

TECHNICAL FIELD

The present application claims priority to Korean Patent Application No. 10-2020-0131452 filed on Oct. 12, 2020 in the Republic of Korea, the disclosures of which are incorporated herein by reference.

The present disclosure relates to a battery management apparatus and method, and more particularly, to a battery management apparatus and method capable of collecting voltage information of a battery over a longer period.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

After these batteries are produced and assembled, they may go through a distribution process to be delivered to customers. In the distribution process, the battery may be naturally discharges, and in particular, a battery having a defect during the manufacturing process may be discharged more than a normal battery. Therefore, in the battery distribution process, diagnosing defects of a battery by measuring the battery voltage is one of the most important processes.

However, in the battery distribution process, there is a limit for a worker to measure the voltage of each battery.

In addition, since a commercial power is not supplied in most cases in the battery distribution process, the amount of power that can be provided to measure the battery voltage and output the measured voltage to a server is inevitably limited.

Therefore, in order to continuously diagnose the state of the battery in the battery distribution process, it is required to develop a technology that can dramatically reduce power consumption by reducing unnecessary power consumption.

DISCLOSURE

Technical Problem

The present disclosure is designed to solve the problems of the related art, and therefore the present disclosure is directed to providing a battery management apparatus and method that may collect a voltage of a battery for a longer period of time with a limited power by adjusting a communication cycle and/or a voltage measurement cycle in consideration of ambient temperature and ambient humidity.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to one aspect of the present disclosure may include: a voltage measuring unit configured to measure a voltage of a battery at every preset voltage measurement cycle; a communication unit configured to output voltage information for the voltage measured by the voltage measuring unit at every preset communication cycle; a power unit configured to provide an operation power to the communication unit when the communication unit operates; an environment information measuring unit configured to measure environment information including at least one of ambient temperature and humidity of the power unit; and a control unit configured to receive the measured environment information from the environment information measuring unit, judge whether the power unit is operable based on at least one of the received environment information, a capacity of the power unit, and a consumed current and a communication time consumed for the communication unit to output the voltage information, and control an operation of the communication unit according to a judgment result about whether the power unit is operable.

When it is judged that the power unit is operable, the control unit may be configured to operate the communication unit to output the voltage information.

The control unit may be configured to calculate a diagnostic coefficient for the power unit based on the environment information, calculate an available limit for the power unit based on the calculated diagnostic coefficient, the capacity of the power unit, the consumed current and the communication time, and judge whether the power unit is operable according to the calculated available limit.

The available limit may be configured to decrease as the calculated diagnostic coefficient is greater.

The control unit may be configured to calculate the diagnostic coefficient according to a temperature difference between a criterion temperature preset for the power unit and the ambient temperature of the power unit and a humidity difference between a criterion humidity preset for the power unit and the ambient humidity of the power unit.

The control unit may be configured to classify a high-temperature section and a low-temperature section based on the criterion temperature, and calculate the diagnostic coefficient to be greater an instance where the ambient temperature of the power unit belongs to the low-temperature section rather than an instance where the ambient temperature of the power unit belongs to the high-temperature section.

The control unit may be configured to compare the available limit with a first criterion value and determine whether or not to change the communication cycle according to the comparison result.

The control unit may be configured to increase the communication cycle when the available limit is less than the first criterion value.

The control unit may be configured to judge that the power unit is operable when the available limit is equal to or greater than the first criterion value.

When the available limit is less than the first criterion value, the control unit may be configured to compare the available limit with a second criterion value, and judge that the power unit is not operable when the available limit is less than the second criterion value.

When the available limit is less than the first criterion value, the control unit may be configured to increase the communication cycle and the voltage measurement cycle.

A battery management apparatus according to another aspect of the present disclosure may further include a storage unit configured to store the voltage information about the voltage measured by the voltage measuring unit at every voltage measurement cycle.

The communication unit may be configured to access the storage unit at every communication cycle and output the stored voltage information.

A battery storage system according to still another aspect of the present disclosure may include the battery management apparatus according to one aspect of the present disclosure.

A battery management method according to still another aspect of the present disclosure may include: an environment information measuring operation of measuring environment information including at least one of ambient temperature and humidity of a power unit; an operability determining operation of judging whether the power unit is operable based on at least one of the environment information measured in the environment information measuring operation, a capacity of the power unit, and a consumed current and a communication time consumed for a communication unit to output voltage information for a battery; and a communication unit controlling operation of controlling an operation of the communication unit according to a judgment result about whether the power unit is operable, wherein the power unit may be configured to provide an operation power to the communication unit when the communication unit operates.

Advantageous Effects

According to one aspect of the present disclosure, there is an advantage that voltage information of the battery may be collected for a longer period by changing the communication cycle and/or the voltage measurement cycle according to the available limit of the power unit.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
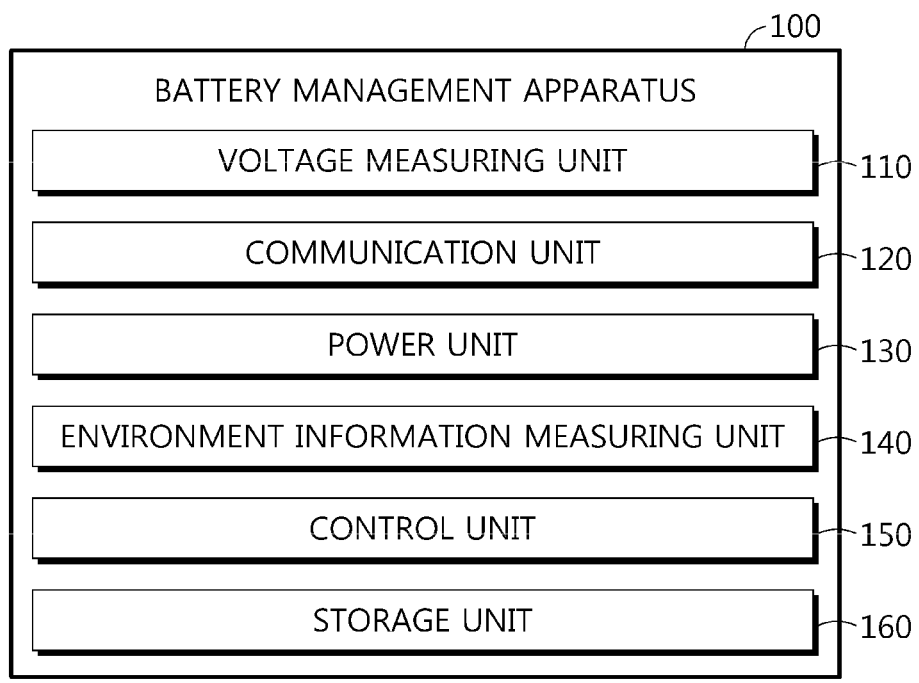
FIG. 1 is a diagram schematically showing a battery management apparatus according to an embodiment of the present disclosure.

Referring to FIG. 1, a battery management apparatus 100 according to an embodiment of the present disclosure may include a voltage measuring unit 110, a communication unit 120, a power unit 130, an environment information measuring unit 140, and a control unit 150.

The voltage measuring unit 110 may be configured to measure a voltage of a battery at every preset voltage measurement cycle.

Here, the battery may refer to one physically separable independent cell including a negative electrode terminal and a positive electrode terminal. For example, one pouch-type lithium polymer cell may be regarded as a battery cell. In addition, the battery may be a battery module in which one or more cells are connected in series and/or in parallel.

For example, the battery may be stored in a predetermined storage space after being produced and before being shipped. The voltage measuring unit 110 may be connected to the battery to measure the voltage of the battery during a storage period of the battery.

The communication unit 120 may be configured to output voltage information for the voltage measured by the voltage measuring unit 110 at every preset communication cycle.

Here, the communication cycle is a preset cycle, and the communication unit 120 may be switched to a wake-up mode at every communication cycle in order to reduce power consumption. In addition, the communication unit 120 may be switched back to a sleep mode after outputting the voltage information.

Specifically, the communication unit 120 may be configured to communicate with the outside. For example, the communication unit 120 may transmit the voltage information for the battery to a voltage information collecting device in the outside of the battery management apparatus 100. Also, the communication unit 120 may transmit the voltage information to a server.

The power unit 130 may be configured to provide an operation power to the communication unit 120.

Preferably, the power unit 130 may provide the operation power only to the communication unit 120. In addition, the components of the battery management apparatus 100 such as the voltage measuring unit 110, the environment information measuring unit 140 and the control unit 150 may receive the operation power from the battery.

For example, the capacity of the power unit 130 may be limited. That is, the power unit 130 may be a power storage unit that is not connected to commercial power and has a predetermined capacity.

The environment information measuring unit 140 may be configured to measure environment information including at least one of ambient temperature and humidity of the power unit 130.

Preferably, the environment information measuring unit 140 may measure both the ambient temperature and humidity of the power unit 130. That is, the environment information including both the ambient temperature and humidity of the power unit 130 may be measured by the environment information measuring unit 140.

The control unit 150 may be configured to receive the measured environment information from the environment information measuring unit 140.

Specifically, the control unit 150 may be connected to communicate with the environment information measuring unit 140. In addition, the control unit 150 may receive the measured environment information from the environment information measuring unit 140.

The control unit 150 may be configured to judge whether the power unit 130 is operable based on at least one of the received environment information, the capacity of the power unit 130, and the consumed current and the communication time required for the communication unit 120 to output the voltage information.

Here, the capacity of the power unit 130 may be a maximum capacity of the power unit 130. That is, the capacity of the power unit 130 may be the maximum capacity of the power unit 130 in the BOL (Beginning Of Life) state.

In addition, the consumed current may be a current consumed while the communication unit 120 is outputting the voltage information.

In addition, the communication time may be a time consumed while the communication unit 120 is outputting the voltage information.

Preferably, the control unit 150 may judge whether the power unit 130 is operable before the communication unit 120 is switched to a wake-up mode. For example, when the available capacity of the power unit 130 is insufficient, the voltage information may not be output even if the communication unit 120 is switched to the wake-up mode because the communication unit 120 cannot receive sufficient power from the power unit 130. Accordingly, the control unit 150 may judge in advance whether the power unit 130 is operable before the communication unit 120 is switched to the wake-up mode.

The control unit 150 may be configured to control the operation of the communication unit 120 according to a judgment result about whether the power unit 130 is operable.

For example, the control unit 150 may be configured to operate the communication unit 120 to output the voltage information, when the power unit 130 is judged to be operable. That is, when it is judged that the power unit 130 is operable, the control unit 150 may switch the communication unit 120 to a wake-up mode according to a communication cycle. In this case, the communication unit 120 may receive the operation power from the power unit 130. The communication unit 120 switched to the wake-up mode may output the voltage information to the outside.

Conversely, when it is judged that the power unit 130 is not operable, the control unit 150 may keep the communication unit 120 in a sleep mode. In addition, the control unit 150 may output a notification to the outside to inform that the power unit 130 is not operable.

The battery management apparatus 100 according to an embodiment of the present disclosure has an advantage of more accurately judging whether the power unit 130 is operable by considering not only the consumption power and communication time required in the communication process and the available capacity of the power unit 130 capable of supplying the operation power to the communication unit 120, but also the ambient environment information of the power unit 130.

For example, since the power unit 130 is a power storage unit having a predetermined capacity, performance deviation may occur depending on ambient temperature and humidity during operation. That is, more power may be consumed in a case where the power unit 130 provides the operation power to the communication unit 120 in a high temperature and high humidity situation rather than the case where the power unit 130 provides the operation power to the communication unit 120 in an optimum temperature and optimum humidity condition. Therefore, by judging whether the power unit 130 is operable in consideration of the ambient environment information of the power unit 130, the control unit 150 may prevent the voltage information output by the communication unit 120 from being stopped or the power unit 130 from being overdischarged beyond the limit. That is, the control unit 150 may more accurately judge whether the power unit 130 is operable by considering the ambient environment information of the power unit 130.

Meanwhile, the control unit 150 provided in the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 150 may be implemented as a set of program modules. At this time, the program module may be stored in a memory and executed by the control unit 150. The memory may be located inside or out of the control unit 150 and may be connected to the control unit 150 by various well-known means.

In addition, the battery management apparatus 100 may further include a storage unit 160. The storage unit 160 may store data necessary for operation and function of each component of the battery management apparatus 100, data generated in the process of performing the operation or function, or the like. The storage unit 160 is not particularly limited in its kind as long as it is a known information storage means that can record, erase, update and read data.

As an example, the information storage means may include RAM, flash memory, ROM, EEPROM, registers, and the like. In addition, the storage unit 160 may store program codes in which processes executable by the control unit 150 are defined.

For example, the storage unit 160 may be configured to store the voltage information about the voltage measured by the voltage measuring unit 110 at every voltage measurement cycle. In addition, the communication unit 120 may be configured to access the storage unit 160 at each communication cycle and output the stored voltage information.

Hereinafter, an embodiment in which the control unit 150 judges whether the power unit 130 is operable will be described in more detail.

The control unit 150 may be configured to calculate a diagnostic coefficient for the power unit 130 based on the environment information.

Here, the diagnostic coefficient is calculated based on the ambient environment information of the power unit 130, and may be a factor related to a decrease in performance of the power unit 130 due to the ambient environment information.

Specifically, the control unit 150 may be configured to calculate the diagnostic coefficient according to a temperature difference between a criterion temperature preset for the power unit 130 and the ambient temperature of the power unit 130 and a humidity difference between a criterion humidity preset for the power unit 130 and the ambient humidity of the power unit 130.

Here, the criterion temperature may be an optimum temperature set so that the power unit 130 can operate optimally, and the criterion humidity may be an optimum humidity set so that the power unit 130 can operate optimally. For example, the criterion temperature may be set to 25° C., which is room temperature, and the criterion humidity may be set to 0%.

Therefore, the performance of the power unit 130 may deteriorate as the temperature difference between the criterion temperature and the ambient temperature of the power unit 130 and the humidity difference between the criterion humidity and the ambient humidity of the power unit 130 are large. That is, as the temperature difference and the humidity difference increase, the amount of power of the power unit 130 consumed for the communication unit 120 to output voltage information may be increased.

Preferably, the control unit 150 may be configured to classify a high-temperature section and a low-temperature section based on the criterion temperature, and calculate the diagnostic coefficient to be greater in the case where the ambient temperature of the power unit 130 belongs to the low-temperature section rather than the case where the ambient temperature of the power unit 130 belongs to the high-temperature section.

In general, the performance of the power unit 130 may be further degraded at a low temperature rather than a high temperature. For example, the performance decrease when the temperature of the power unit 130 is decreased from 25° C. to 0° C. may be greater than the performance decrease when the temperature of the power unit 130 is increased from 25° C. to 50° C. Furthermore, when the temperature of the power unit 130 is below 0° C., the performance decrease of the power unit 130 may be further increased.

Therefore, even if the temperature difference between the criterion temperature and the ambient temperature of the power unit 130 is the same in the case where the temperature of the power unit 130 belongs to the low-temperature section and in the case where the temperature belongs to the high-temperature section, the control unit 150 may be configured to calculate the diagnostic coefficient to be greater when the temperature of the power unit 130 belongs to the low-temperature section.

The control unit 150 may be configured to calculate an available limit for the power unit 130 based on the calculated diagnostic coefficient, the capacity of the power unit 130, the consumed current, and the communication time.

Here, the available limit is a factor for judging whether the power unit 130 is operable, and may be expressed as an available time of the power unit 130 based on the diagnostic coefficient, the capacity of the power unit 130, the consumed current, and the communication time. Also, it should be noted that the available limit of the power unit 130 expressed in units of time can also be expressed as a remaining capacity of the power unit 130 or the communication available number of the power unit 130 through appropriate unit conversion.

Preferably, the available limit may be configured to decrease as the calculated diagnostic coefficient is greater. That is, as the diagnostic coefficient increases, the available limit of the power unit 130 may be reduced. For example, as the temperature difference between the ambient temperature of the power unit 130 and the criterion temperature and the humidity difference between the ambient humidity of the power unit 130 and the criterion humidity increase, the diagnostic coefficient may be calculated to be greater, and the available limit may be reduced by this diagnostic coefficient.

For example, the available limit may be calculated according to Equation 1 below.

$$D = \frac{C}{I} - \sum(K \times T) \quad \text{[Equation 1]}$$

In Equation 1, D may be the available limit, C may be the maximum capacity of the power unit 130 (the maximum capacity in the initial state), I may be the consumed current, K may be the diagnostic coefficient, and T may be a communication time. Specifically, the unit of C may be [mAh], the unit of I may be [mA], K may be a constant, and the unit of T may be [s] or [h]. In addition, in Equation 1, in order to calculate the available limit (D) in units of second [s] or hour [h], an appropriate coefficient for unit conversion may be multiplied.

Accordingly, the available limit (D) calculated according to Equation 1 may indicate the available time of the power unit 130 according to the current capacity of the power unit 130. This available time may be reduced as the power unit 130 operates (as the operation power is supplied to the communication unit 120). That is, in Equation 1, since the product of the diagnostic coefficient (K) and the communication time (T) is accumulated, the calculated available limit (D) may decrease as the power unit 130 operates.

In addition, referring to Equation 1, the available limit (D) may be further reduced as the diagnostic coefficient (K) increases. That is, as the diagnostic coefficient (K) is calculated to be greater according to the ambient environment information of the power unit 130, the decrease in the available limit (D) may be increased.

After the available limit is calculated, the control unit 150 may be configured to judge whether the power unit 130 is operable according to the calculated available limit. Specifically, the control unit 150 may be configured to compare the available limit with a first criterion value and determine whether or not to change the communication cycle according to the comparison result.

For example, the control unit 150 may be configured to judge that the power unit 130 is operable, if the available limit is equal to or greater than the first criterion value. As another example, when the available limit is less than the first criterion value, the control unit 150 may be configured to increase the communication cycle of the communication unit 120. That is, when the available limit is less than the first criterion value, the power unit 130 may not normally supply the operation power to the communication unit 120 according to the preset communication cycle. Therefore, if the available limit is less than the first criterion value, the preset communication cycle may be increased so that the communication frequency of the communication unit 120 is reduced.

In addition, the control unit 150 may judge whether the power unit 130 is not operable.

Specifically, when the available limit is less than the first criterion value, the control unit 150 may compare the available limit with a second criterion value. Here, the second criterion value may be set to be less than the first criterion value.

If the available limit is less than the second criterion value, the control unit 150 may be configured to judge that the power unit 130 is not operable.

That is, after comparing the calculated available limit with the first criterion value first, if the available limit is less than the first criterion value, the control unit 150 may judge whether the power unit 130 is operable by comparing the calculated available limit with the second criterion value secondarily.

In summary, if the available limit is equal to or greater than the first criterion value, the power unit 130 may normally supply the operation power to the communication unit 120 according to the preset communication cycle. Accordingly, if the available limit is equal to or greater than the first criterion value, the control unit 150 may judge that the power unit 130 is operable.

If the available limit is less than the first criterion value and equal to or greater than the second criterion value, the power unit 130 may not normally supply the operation power to the communication unit 120 according to the preset communication cycle, but the power unit 130 may supply the operation power to the communication unit 120 normally at any increased communication cycle. Therefore, if the available limit is less than the first criterion value and equal to or greater than the second criterion value, the control unit 150 may judge that the power unit 130 is operable after increasing the preset communication cycle.

If the available limit is less than the second criterion value, the remaining capacity of the power unit 130 is very small, and the power unit 130 may not normally supply the operation power to the communication unit 120 even if the preset communication cycle is increased. Accordingly, when the available limit is less than the second criterion value, the control unit 150 may judge that the power unit 130 is not operable.

Also, the control unit 150 may be configured to increase the voltage measurement cycle, if the available limit is less than the first criterion value.

As described above, in the process where the control unit 150 calculates the available limit, the consumed current and the communication time required for the communication unit 120 to output the voltage information may be included. In addition, the communication unit 120 may be configured to output the voltage information stored in the storage unit 160. That is, since the voltage information output by the communication unit 120 is stored in the storage unit 160, as the voltage information stored in the storage unit 160 is more, the consumed current and the communication time may increase further.

For example, when the available limit calculated by the control unit 150 is less than the first criterion value, the communication cycle may need to be increased because the available capacity of the power unit 130 is not much left. However, even if the communication cycle is increased, if the voltage measurement cycle for the voltage measuring unit 110 is maintained as it is, the communication unit 120 must output a larger amount of voltage information than before at every communication cycle. That is, as the communication cycle is increased, the period at which the communication unit 120 is switched to the wake-up mode is increased (that is, the frequency is decreased), but the amount of voltage information to be output when switching to the wake-up mode is increased, so the power consumption of the power unit 130 may not be effectively reduced.

Accordingly, when the calculated available limit is less than the first criterion value, the control unit 150 may increase both the communication cycle and the voltage measurement cycle, thereby effectively reducing the power consumption of the power unit 130.

The battery management apparatus 100 according to the present disclosure may be applied to a BMS (Battery Management System). That is, the BMS according to the present disclosure may include the battery management apparatus 100 described above. In this configuration, at least some of the components of the battery management apparatus 100 may be implemented by supplementing or adding functions of the configuration included in the conventional BMS. For example, the voltage measuring unit 110, the communication unit 120, the power unit 130, the environment information measuring unit 140, the control unit 150, and the storage unit 160 may be implemented as components of the BMS.

Figure 2:
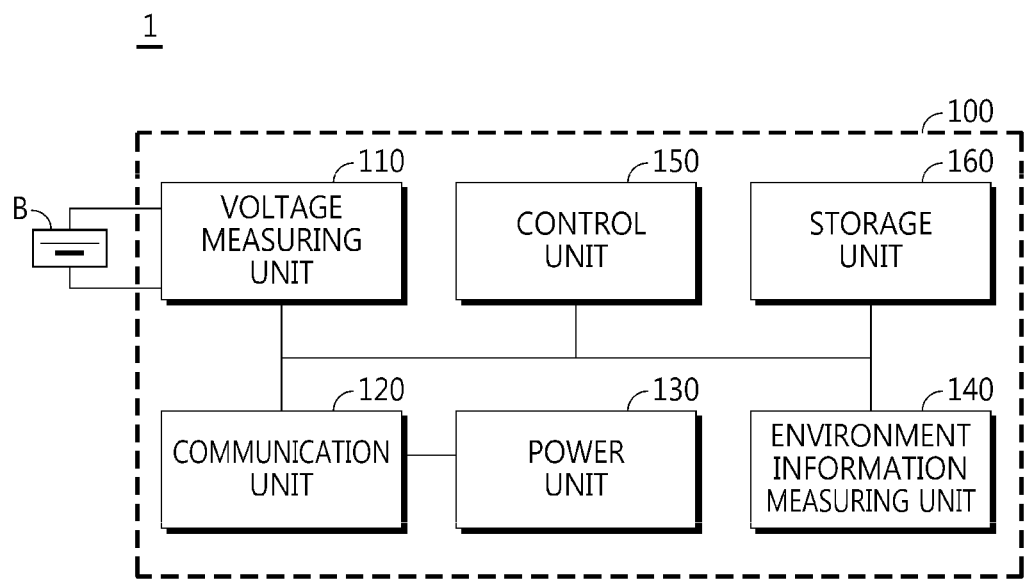
FIG. 2 is a diagram schematically showing a battery storage system according to another embodiment of the present disclosure.

FIG. 2 is a diagram schematically showing a battery storage system 1 according to another embodiment of the present disclosure.

Referring to FIG. 2, the battery storage system 1 may include at least one battery B and the battery management apparatus 100.

Here, the battery B may be stored in a predetermined storage space. For example, the battery B may be stored in a warehouse before shipment, or stored in a container in a distribution process after shipment.

That is, the battery management apparatus 100 may control the operation of the power unit 130 in consideration of ambient environment information of the power unit 130 or the like in order to secure the stored voltage information of the battery B for a longer period of time. In addition, the battery management apparatus 100 has an advantage of judging whether the power unit 130 is operable and adjusting the communication cycle of the communication unit 120 and/or the voltage measurement cycle of the voltage measuring unit 110 in order to effectively use the limited capacity of the power unit 130 according to the judged operability.

Figure 3:
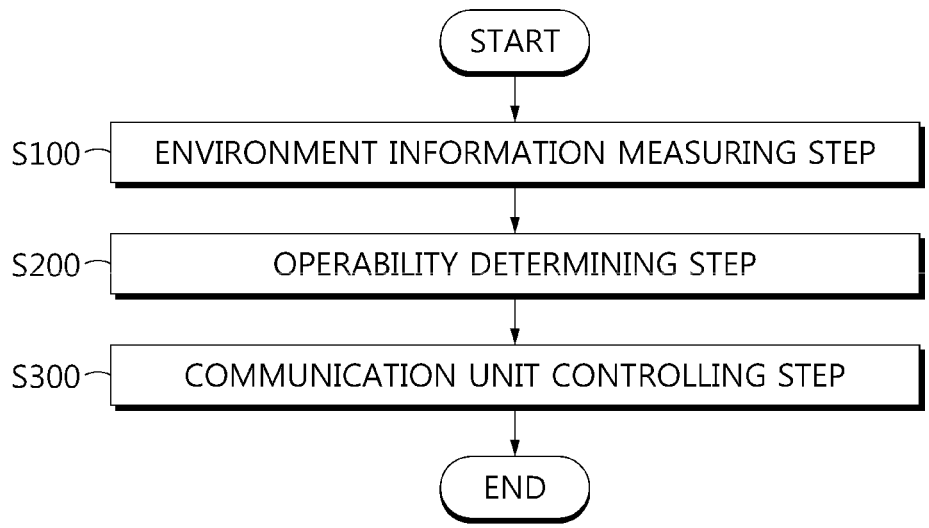
FIG. 3 is a diagram schematically showing a battery management method according to still another embodiment of the present disclosure.

FIG. 3 is a diagram schematically showing a battery management method according to still another embodiment of the present disclosure.

Preferably, each step of the battery management method may be performed by the battery management apparatus 100. Hereinafter, for convenience of description, content overlapping with the previously described content will be briefly described or omitted.

Referring to FIG. 3, the battery management method may include an environment information measuring step (S100), an operability determining step (S200), and a communication unit controlling step (S300).

The environment information measuring step (S100) is a step of measuring environment information including at least one of ambient temperature and humidity of the power unit 130, and may be performed by the environment information measuring unit 140.

For example, the environment information measuring unit 140 may measure both ambient temperature and humidity of the power unit 130.

The operability determining step (S200) is a step of judging whether the power unit 130 is operable based on at least one of the environment information measured in the environment information measuring step (S100), the capacity of the power unit 130, and the consumed current and the communication time required for the communication unit 120 to output the voltage information for the battery B, and may be performed by the control unit 150.

Figure 4:
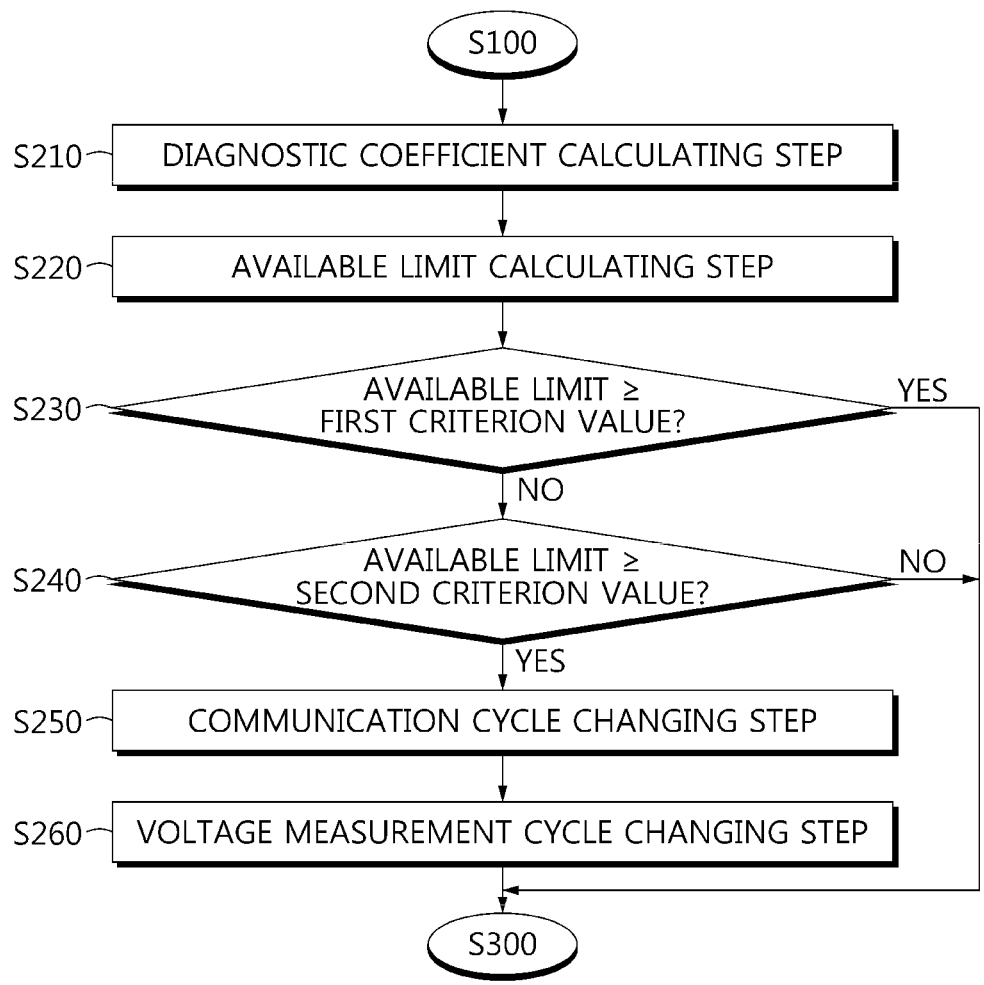
FIG. 4 is a diagram schematically showing an operability determining step of the battery management method according to still another embodiment of the present disclosure.

The specific details of the operability determining step (S200) will be described with reference to FIG. 4. FIG. 4 is a diagram schematically showing the operability determining step (S200) of the battery management method according to still another embodiment of the present disclosure.

Step S210 is a diagnostic coefficient calculating step and may be performed by the control unit 150. The control unit 150 may calculate the diagnostic coefficient for the power unit 130 based on the environment information (e.g., temperature and humidity) measured by the environment information measuring unit 140.

Step S220 is an available limit calculating step and may be performed by the control unit 150. The control unit 150 may calculate the available limit for the power unit 130 based on the calculated diagnostic coefficient, the maximum capacity of the power unit 130, the consumed current by the communication unit 120, and the communication time of the communication unit 120. For example, the control unit 150 may calculate the available limit for the power unit 130 based on Equation 1.

Step S230 is a step performed by the control unit 150, and the control unit 150 may compare the calculated available limit with a first criterion value.

If the comparison result of Step S230 is YES, that is, if the available limit is greater than or equal to the first criterion value, the control unit 150 may judge that the power unit 130 is in an operable state. After that, the communication unit controlling step (S300) may be performed.

Conversely, if the comparison result of Step S230 is NO, that is, if the available limit is less than the first criterion value, Step S240 may be performed.

Step S240 is a step performed by the control unit 150, and the control unit 150 may compare the calculated available limit with a second criterion value.

If the comparison result of Step S240 is YES, that is, if the available limit is less than the first criterion value and greater than or equal to the second criterion value, the control unit 150 may judge that the power unit 130 is in an operable state.

However, when the comparison result of Step S240 is YES, Step S250 and Step S260 may be performed by the control unit 150. In Step S250, the communication cycle of the communication unit 120 may be increased, so that the communication frequency of the communication unit 120 may be reduced. In addition, in Step S260, the voltage measurement cycle of the voltage measuring unit 110 may be increased, so that the frequency of measuring the voltage of the voltage measuring unit 110 may be reduced. That is, when the available limit is less than the first criterion value and equal to or greater than the second criterion value, the control unit 150 judges that the power unit 130 is in an operable state, but in order to efficiently use the capacity of the power unit 130, the communication cycle of the communication unit 120 and the voltage measurement cycle of the voltage measuring unit 110 may be increased.

If the comparison result of Step S240 is NO, that is, if the available limit is less than the second criterion value, the control unit 150 may judge that the power unit 130 is not operable. After that, the communication unit controlling step (S300) may be performed.

The communication unit controlling step (S300) is a step of controlling the operation of the communication unit 120 according to the judgment result about whether the power unit 130 is operable, and may be performed by the control unit 150.

For example, when the power unit 130 is judged to be operable (when the comparison result of Step S230 is YES), the control unit 150 may operate the communication unit 120 at every communication cycle to output the voltage information of the battery B measured by the voltage measuring unit 110.

As another example, if the power unit 130 is in an operable state but the available limit of the power unit 130 is less than the first criterion value and greater than or equal to the second criterion value (when the comparison result of Step S230 is NO and the comparison result of Step S240 is YES), the control unit 150 may increase the communication cycle to reduce the operation frequency of the communication unit 120. In this case, the control unit 150 may also increase the voltage measurement cycle of the voltage measuring unit 110, so that the frequency of measuring the voltage of the battery B by the voltage measuring unit 110 is reduced.

As still another example, when the power unit 130 is judged to be in a non-operable state (if the comparison result of Step S240 is NO), the control unit 150 may control the communication unit 120 not to operate, and output an alarm for requesting charging or replacement of the power unit 130.

According to the above steps, the battery management method according to another embodiment of the present disclosure has an advantage of securing the voltage information of the battery B at maximum efficiency by efficiently utilizing the limited capacity of the power unit 130 to continuously measure the voltage of the battery B for as long period as possible.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery storage system
100: battery management apparatus
110: voltage measuring unit
120: communication unit
130: power unit
140: environment information measuring unit
150: control unit
160: storage unit

What is claimed is:

1. A battery management apparatus, comprising:
a voltage measuring unit configured to measure a voltage of a battery at every preset voltage measurement cycle;
a communication unit configured to output voltage information for the voltage measured by the voltage measuring unit at every preset communication cycle;
a power unit configured to provide an operation power to the communication unit when the communication unit operates;
an environment information measuring unit configured to measure environment information including at least one of ambient temperature and humidity of the power unit; and
a control unit configured to:
receive the measured environment information from the environment information measuring unit,
judge whether the power unit is operable based on at least one of the received environment information, a capacity of the power unit, and a consumed current and a communication time consumed for the communication unit to output the voltage information, and
control an operation of the communication unit according to a judgment result about whether the power unit is operable,
wherein the control unit is configured to calculate a diagnostic coefficient for the power unit based on the environment information.

2. The battery management apparatus according to claim 1,
wherein when it is judged that the power unit is operable, the control unit is configured to operate the communication unit to output the voltage information.

3. The battery management apparatus according to claim 1,
wherein the control unit is configured to:
calculate an available limit for the power unit based on the calculated diagnostic coefficient, the capacity of the power unit, the consumed current and the communication time, and
judge whether the power unit is operable according to the calculated available limit.

4. The battery management apparatus according to claim 3,
wherein the available limit is configured to decrease as the calculated diagnostic coefficient is greater.

5. The battery management apparatus according to claim 4,
wherein the control unit is configured to calculate the diagnostic coefficient according to a temperature difference between a criterion temperature preset for the power unit and the ambient temperature of the power unit and a humidity difference between a criterion humidity preset for the power unit and the ambient humidity of the power unit.

6. The battery management apparatus according to claim 5,
wherein the control unit is configured to classify a high-temperature section and a low-temperature section based on the criterion temperature, and calculate the diagnostic coefficient to be greater in an instance where the ambient temperature of the power unit belongs to the low-temperature section rather than an instance where the ambient temperature of the power unit belongs to the high-temperature section.

7. The battery management apparatus according to claim 3,
wherein the control unit is configured to compare the available limit with a first criterion value and determine whether or not to change the communication cycle according to the comparison result.

8. The battery management apparatus according to claim 7,
wherein the control unit is configured to:
increase the communication cycle when the available limit is less than the first criterion value, and
judge that the power unit is operable when the available limit is equal to or greater than the first criterion value.

9. The battery management apparatus according to claim 8,
wherein when the available limit is less than the first criterion value, the control unit is configured to compare the available limit with a second criterion value, and judge that the power unit is not operable when the available limit is less than the second criterion value.

10. The battery management apparatus according to claim 8,
wherein when the available limit is less than the first criterion value, the control unit is configured to increase the communication cycle and the voltage measurement cycle.

11. The battery management apparatus according to claim 7, further comprising:
a storage unit configured to store the voltage information about the voltage measured by the voltage measuring unit at every voltage measurement cycle,
wherein the communication unit is configured to access the storage unit at every communication cycle and output the stored voltage information.

12. A battery storage system, comprising the battery management apparatus according to claim 1.

13. A battery management method, comprising:
an environment information measuring operation of measuring environment information including at least one of ambient temperature and humidity of a power unit;
an operability determining operation of judging whether the power unit is operable based on at least one of the environment information measured in the environment information measuring operation, a capacity of the power unit, and a consumed current and a communication time consumed for a communication unit to output voltage information for a battery;

a communication unit controlling operation of controlling an operation of the communication unit according to a judgment result about whether the power unit is operable; and a diagnostic coefficient calculating operation of calculating the diagnostic coefficient for the power unit based on the environment information, wherein the power unit is configured to provide an operation power to the communication unit when the communication unit operates.

14. The battery management method according to claim 13, wherein the diagnostic coefficient is calculated according to a temperature difference between a criterion temperature preset for the power unit and the ambient temperature of the power unit and a humidity difference between a criterion humidity preset for the power unit and the ambient humidity of the power unit.

15. The battery management method according to claim 13, further comprising:

calculating an available limit for the power unit based on the calculated diagnostic coefficient, the capacity of the power unit, the consumed current and the communication time, wherein the judgement result about whether the power unit is operable is based on the calculated available limit.

* * * * *